United States Patent [19]

Shibata et al.

[11] 4,331,930
[45] May 25, 1982

[54] BIAS CIRCUIT FOR POWER AMPLIFIER

[75] Inventors: Isumi Shibata; Kazumasa Sakai; Nobuyuki Sanpei, all of Tokyo, Japan

[73] Assignee: Trio Kabushiki Kaisha, Tokyo, Japan

[21] Appl. No.: 110,540

[22] Filed: Jan. 8, 1980

[30] Foreign Application Priority Data

Jan. 18, 1979 [JP] Japan .................................. 54-5402

[51] Int. Cl.³ ............................................ H03F 3/20
[52] U.S. Cl. .................................... 330/267; 330/273; 330/296
[58] Field of Search ............... 330/273, 274, 267, 268, 330/298, 296

[56] References Cited

U.S. PATENT DOCUMENTS 4,077,013  2/1978  Morez et al. ......................... 330/267
4,216,437  8/1980  Sakaida ................................ 330/298
4,237,425  12/1980  Spiegel ................................ 330/273

OTHER PUBLICATIONS

Jack C. Sondermeyer, "Inexpensive Audio Power Amplifiers Can Be Reliable", The Electronic Engineer, Dec. 1967, pp. 35–39.

Primary Examiner—James B. Mullins
Assistant Examiner—Gene Wan
Attorney, Agent, or Firm—Gerald J. Ferguson, Jr.; Joseph J. Baker

[57] ABSTRACT

A bias circuit for single-ended push-pull amplifiers permits class A or class AB operation while substantially reducing the idling current of the output transistors at low input signal levels. The bias circuit includes a DC current limiting circuit comprised of transistors that are connected between the common output of the amplifier and the bases of the output transistors. The transistors of the DC current limiting circuit limit the idling currents of the output transistors when there is no input signal applied to the amplifier. The bias circuit further includes RC/diode circuits which operate to increase or decrease the bias voltages of the transistors of the DC current limiting circuit corresponding to a decrease or an increase of the output voltage of the amplifier. In this way, the idling currents of the output transistors are changed so as to effectively follow the input signal power.

7 Claims, 10 Drawing Figures

FIG. 1
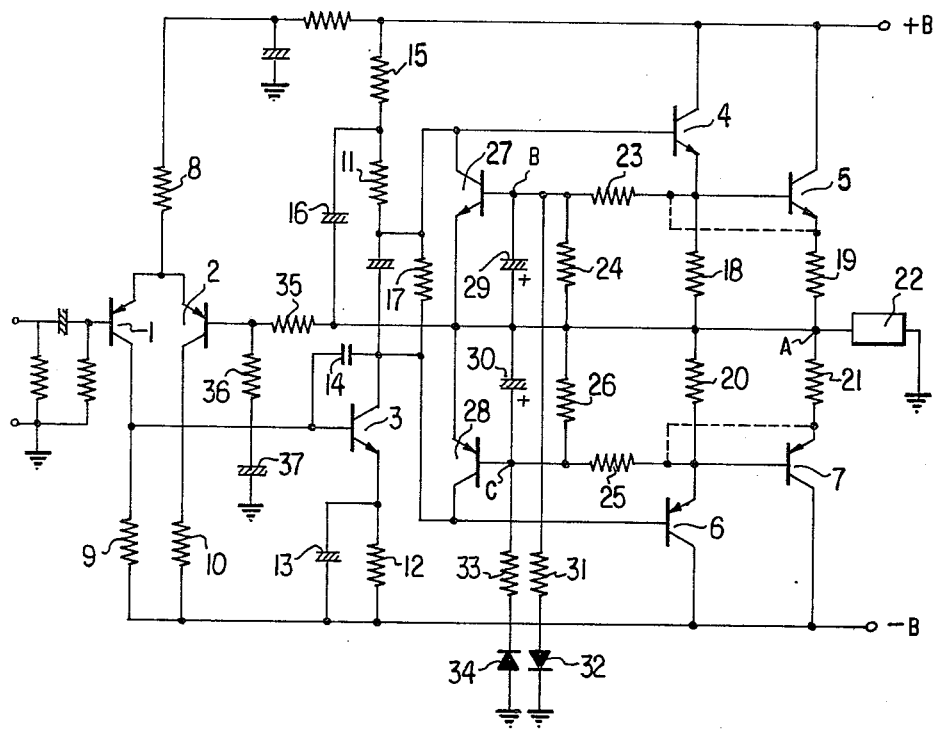
(a)
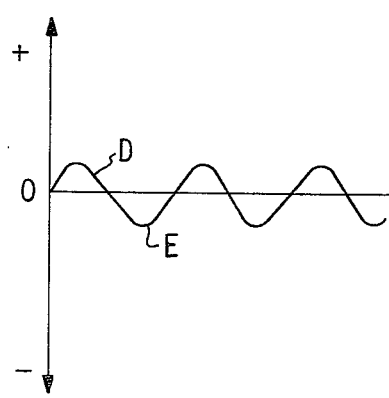
(b)
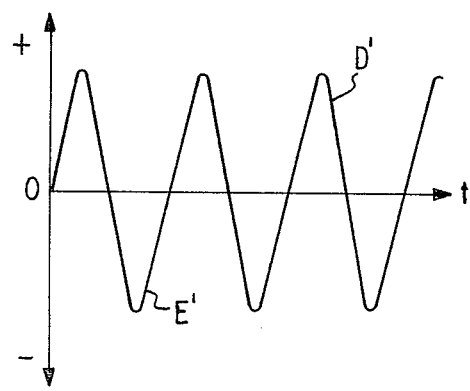
FIG. 4

FIG. 2
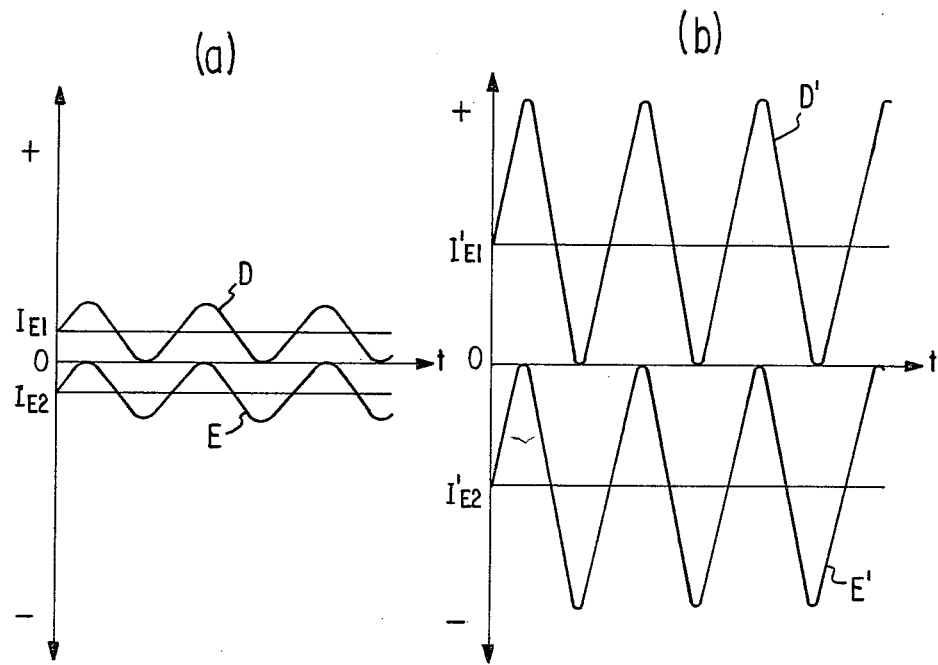
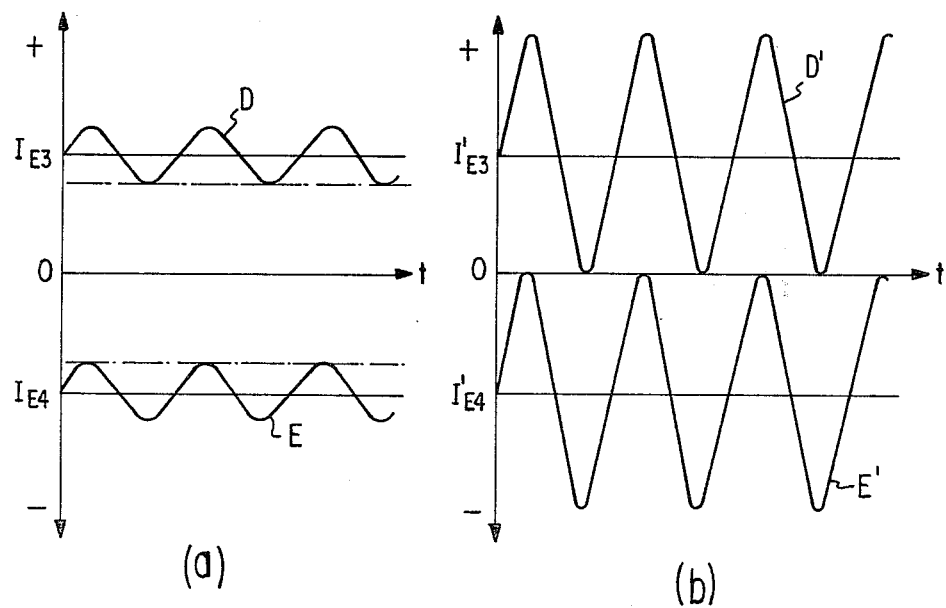
FIG. 3

BIAS CIRCUIT FOR POWER AMPLIFIER

BACKGROUND OF THE INVENTION

This invention relates to a bias circuit for power amplifiers, especially a single-ended push-pull (noted as SEPP hereafter in this specification) amplifier.

Conventionally, in a class A SEPP amplifier, a large DC bias current is passed to the final stage of an SEPP amplifier at all times in order to obtain class A operation. Consequently, there is a shortcoming that effeciency at low output power is extremely poor and a large capacity power supply and a large thermal radiator are necessary.

There is also known a class AB SEPP amplifier in which the DC bias current is passed to a certain degree, thus operating at class A up to a fixed output power and not allowing class A operation when the output is higher than the fixed output power. However, this class AB SEPP amplifier has a shortcoming that no class A operation is available at an output higher than the fixed output power.

Also, there is known a class B SEPP amplifier designed to pass DC bias current forcibly to the output transistors even at the normal cut-off time of the class B SEPP amplifier so that the output transistors comprising the output stage are not cut off. Although this class B SEPP amplifier may be called a class A amplifier in the sense that the output transistors of the output stage do not become cut-of, but it has a shortcoming that the current waveform of each transistor is different from that of the class A amplifier.

SUMMARY OF THE INVENTION

Thus, this invention was made in view of the above problems with an objective to present a bias circuit for power amplifiers that can eliminate the described shortcomings, effect class A operation by changing the idling current corresponding to the output power to a small idling current at low output power and to a large idling current at a high output power, and obtain higher efficiency than is obtainable from a conventional class A SEPP amplifier. This is accomplished by providing a bias circuit which includes a DC current limiting circuit comprised of transistors that are connected between the common output of the amplifier and the bases of the output transistors. The transistors of the DC current limiting circuit limit the idling currents of the output transistors when biased by a voltage corresponding to the output current of the output transistors. The bias circuit further includes means for changing the idling currents of the output transistors so as to effectively follow the input signal power.

BRIEF DESCRIPTION OF THE DRAWINGS

The specific nature of the invention, as well as other objects and advantages thereof, will clearly appear from the following description and from the accompanying drawings, in which:

FIG. 1 is a circuit diagram of an SEPP amplifier according to the first practical embodiment of this invention;

FIGS. 2(a) and (b) are waveform diagrams illustrating the operation of the first embodiment of this invention;

FIGS. 3(a) and (b) are waveform diagrams illustrating the operation of a conventional class A SEPP amplifier;

FIGS. 4(a) and (b) are waveform diagrams illustrating the operation of a conventional class B SEPP amplifier;

DETAILED DESCRIPTION OF THE PREFERRED EMBODIMENTS

Figure 5:
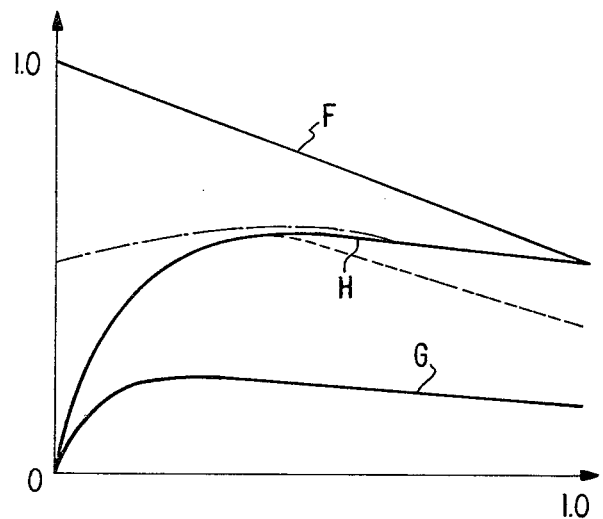
FIG. 5 is a graph showing the relationship between power loss and output power of the output transistors.

Referring now to the drawings, and more particularly to FIG. 1, there is shown a circuit diagram of an SEPP amplifier in which the first embodiment of the invention is used. In FIG. 1, the SEPP amplifier consists of a differential amplifier circuit comprised of transistors 1 and 2, resistors 8, 9, and 10; a voltage amplifier circuit comprised of a transistor 3, resistors 11 and 12, and capacitors 13 and 14; a bootstrap circuit comprised of a resistor 15 and a capacitor 16; a bias circuit comprised of a resistor 17,; and an output circuit comprised of transistors 4 and 6 each in a Darlington connection to output transistors 5 and 7, respectively, and resistors 18, 19, 20, and 21. The bias circuit is biased so as to effect class A operation of the output circuit, thus configuring a direct complementary SEPP amplifier that is commonly used.

In addition, 22 is a load, +B and −B are positive and negative power supplies that respectively output +$V_{CC}$ and −$V_{CC}$ voltage, and point A is a common output point. Resistors 35, 36, and a capacitor 37 comprise a negative feedback circuit.

This example is configured by further addition of the following circuit to the direct complementary SEPP amplifier. A DC current limiting circuit comprises a transistor 27 connected in parallel between the common output point and the base of the transistor 4, and a voltage divider comprising a series circuit of resistors 23 and 24 connected in parallel between the common output point A and the emitter of the transistor. The common connection point of the resistors 23 and 24 is connected to the base of the transistor 27. A capacitor 29 is connected between the base of the transistor 27 and the common output point A, and the base of the transistor 27 is grounded through a resistor 31 and a diode 32. Similarly, a transistor 28 is connected in parallel between the common output point A and the base of the transistor 6, and a series circuit of resistors 25 and 26 is connected in parallel between the common output point A and the emitter of the transistor 6. The common junction point of the resistors 25 and 26 is connected to the base of the transistor 28, thus forming a DC current limiting circuit. A capacitor 30 is connected between the base of the transistor 28 and the common output point A, and the base of the transistor 28 is connected through resistor 33 to the cathode of a diode 34 whose anode is grounded.

In a circuit configured as above, the direct complementary SEPP amplifier consisting of transistors 1, 2, 3, 4, and 6 and output transistors 5 and 7, performs class A amplification. However, when there is no input signal, the voltage at resistor 18 produced by the DC emitter current of transistor 4 is divided by the resistors 23 and 24 and impressed as a base bias voltage for the transistor 27, thus limiting the idling current, namely the DC emitter current, during the time of no input signal of the output transistor 5 to avoid unnecessary current flow. Similarly for transistor 7, the voltage of resistor 20 produced by the DC emitter current of the transistor 6 is divided by resistors 25 and 26 and impressed as a base bias voltage for transistor 28, thus limiting the idling current of the output transistor 7 to avoid unnecessary current flow.

When an input signal is impressed, an AC output appears at the common output point A, and the capacitor 29 is charged through resistor 31 and diode 32 during the positive half cycle of the input signal, and the base of the transistor 27, namely point B, is negatively biased. Thus, the transistor 27 is biased in the direction of cut-off, the DC input current level of the output transistor 5 is increased, and the idling current of the output transistor 5 is increased. And during the negative half cycle of the input signal, the capacitor 30 is charged through the resistor 33 and the diode 34, and the base of the transistor 28, that is the point C is positively biased. Thus, the transistor 28 is biased in the direction of cut-off, the obsolute value of the DC input current level of the output transistor 7 increases, and the absolute value of the idling current of the output transistor 7 increases. Therefore, by properly selecting the resistors 31 and 33, the idling currents of the output transistors 5 and 7 change, and even when an input signal is impressed at an amplitude where class A amplification does not occur with the idling currents of the output transistors 5 and 7 at the time of no input signal, the absolute values of the idling currents of the output transistors 5 and 7 automatically increase and class A amplification occurs.

In other words, when the input signal is small as shown in FIG. 2(a), the idling currents of the output transistors 5 and 7 are respectively $I_{E1}$ and $I_{E2}$, and an emitter current in the waveform of AC current shown by curve D superimposed on the idling current $I_{E1}$ flows to the output transistor 5, and that of AC current shown by curve E superimposed on the idling current $I_{E2}$ flows to the output transistor 7. When the input signal is large as shown in FIG. 2(b), the idling currents of the output transistor 5 and 7 increase resulting respectively in $I'_{E1}$ and $I'_{E2}$, and the emitter current in the waveform of an AC current shown by curve D' superimposed on the idling current $I'_{E1}$ flows to the output transistor 5, and that of the AC current shown by curve E' superimposed on the idling current $I'_{E2}$ flows to the output transistor 7. Thus, class A amplifying action results at all times, and the respective idling currents of the output transistors are limited to the minimum current required to perform class A amplifying operation.

The diode 32 keeps the transistor 27 from functioning during the negative half cycle of the input signal, and the diode 34 keeps the transistor 28 from functioning during the positive period of the input signal.

FIGS. 3(a) and (b) show waveforms of the emitter currents of the output transistors of a conventional class A SEPP amplifier with small input signal and large input signal respectively. Regardless of the size of the input signal, idling currents of $I_{E3}$ and $I_{E4}$ are passed to the output transistor, and emitter currents having the waveform of AC currents shown by curves D and E superimposed respectively on the idling currents $I_{E3}$ and $I_{E4}$ are passed during low input signal periods, and those of AC currents shown by curves D' and E' superimposed on the said idling currents are passed during large input signal periods.

FIGS. 4(a) and (b) shown the waveforms of the emitter currents of the output transistors of a conventional class B SEPP amplifier during the passage of a small input signal and large input signal respectively. Regardless of the size of the input signal, the idling currents passed to the output transistors are zero, and the AC currents in the waveforms of the positive half cycle of the AC currents, curves D and D', flow to one output transistor, and AC currents in the waveforms of the negative half cycle of the AC currents, curves E and E', flow to the other output transistor as the emitter currents.

Thus, when FIGS. 2(a), (b); FIGS. 3(a), (b); and FIGS. 4(a), (b) are compared, it is obvious that only the minimum required idling currents are passed to the output transistors 5 and 7 of the SEPP amplifier of one embodiment of this invention as shown in FIGS. 2(a) and (b).

Next, the collector losses of the output transistors are explained.

The maximum current of the output transistor, a, is expressed by $a = V_{CC}/R_L$, and the idling current pased to the collector, b, is expressed by $b = \alpha V_{CC}/R_L$ ($0 \leq \alpha \leq \frac{1}{2}$). Here, the load is a resistive load and the resistance value is denoted as $R_L$. The voltage between the collector and emitter of the output transistor, $V_{CE}$, is expressed by $V_{CE} = V_{CC}(1 - K \sin \omega t)$, and K is the ratio of the signal output amplitude to the maximum amplitude.

Thus, the collector loss per individual output transistor is as follows:

(a) In the case of a conventional class A SEPP amplifier, the collector current of the output transistor, $I_C$, is:

$$I_C = b + K(a-b) \sin \omega t, \ K(a-b) < b, \ [K > \alpha/(1-\alpha)],$$
and $\alpha = \frac{1}{2}$, and the means power loss of the collectors, $P_C$, is expressed as $$P_C = \frac{V_{CC}^2}{4 R_L} (2 - K^2) \quad (1)$$

(b) In the case of a class B SEPP amplifier, the collector curent of the output transistor, $I_C$, is $$I_C = K a \sin \omega t, \ b = 0, \text{ and } \alpha = 0,$$

and the means power loss of the collectors, $P_C$, is expressed as $$P_C = \frac{V_{CC}^2}{2 R_L} K \left( \frac{2}{\pi} - \frac{K}{2} \right) \quad (2)$$

(c) In the case of an SEPP amplifier using the bias circuit of this invention, the collector current of the output transistor, $I_C$, is $$I_C = b + K(a-b) \sin \omega t, \ K(a-b) = b, \text{ and}$$
$$K = \alpha/(1-\alpha),$$

and the means power loss of the collectors, $P_C$, is expressed as $$P_C = \frac{V_{CC}^2}{2 R_L} \cdot \frac{K(2-K)}{1+K} \qquad (3)$$

Consequently, when the output power is plotted on the abscissa and the mean power loss per individual output transistor, on the ordinate, FIG. 5 results, where the power loss of the output transistor in the case of a conventional class A SEPP amplifier is shown by the straight line F, the power loss of the output transistor in the case of a class B SEPP amplifier, by curve G, and the power loss of the output transistor in the case of an SEPP amplifier using the bias circuit of this invention, by curve H, respectively. Thus, as is obvious from FIG. 5, although the power loss of the output transistor in the case of an SEPP amplifier using the bias circuit of this invention is greater than the power loss of the output transistor when a class B SEPP amplifier is used, its power loss of the output transistor during a small input signal is markedly smaller compared with the power loss of the output transistor when a conventional class A SEPP amplifier is used, and it equals to the power loss of the output transistor of a conventional class A SEPP amplifier at the rated output power, thus demonstrating its high efficiency.

The above explanation concerned the class A operation of an SEPP amplifier using the bias circuit of one practical embodiment of this invention. However, the bias circuit of this embodiment of the invention can be applied even in the case of class AB operation by adjusting the bias circuit comprised of resistor 17. The power loss per individual output transistor in this case is as shown in FIG. 5 by the dotted line.

Furthermore, by selecting fixed values for resistors 23–26 that comprise the DC current limiting circuit, the idling current of the output transistors 5 and 7 during no input signal can be set to fixed values, and the lower loss per individual output transistor can be made almost constant as shown in FIG. 5 by the dot-dash curve. In this case, it is effective in making the temperature rise in the SEPP amplifier almost constant regardless of the value of the output power.

Figure 6:
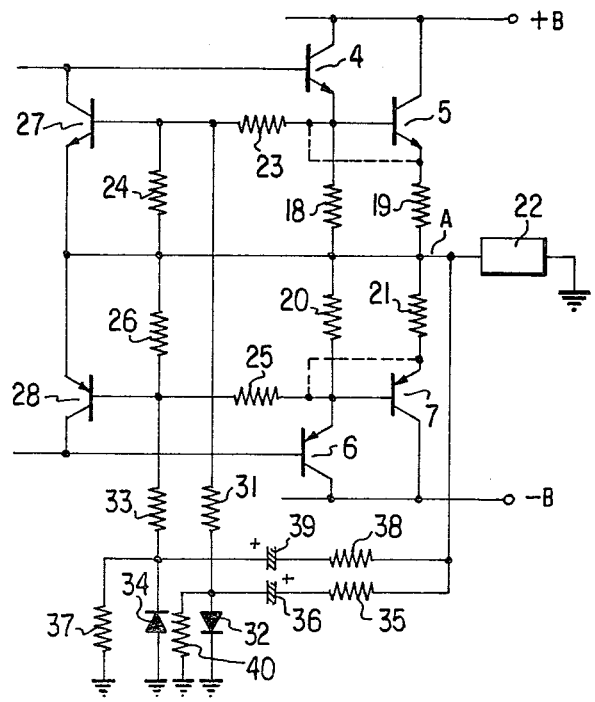
FIG. 6 is a circuit diagram of a SEPP amplifier according to the second practical embodiment of this invention.

FIG. 6 is a circuit diagram of an SEPP amplifier using the second practical embodiment of this invention. FIG. 6 shows only the output circuit of the SEPP amplifier, and the same notations are used for the same components as in the first embodiment shown in FIG. 1.

This embodiment is configured by connecting a series circuit of a resistor 35 and a capacitor 36 between the common output point A and the anode of the diode 32 and by grounding the anode of the diode 32 through a resistor 40, instead of the capacitor 29 as in the first practical embodiment; and a series circuit of a resistor 38 and a capacitor 39 is connected between the common output point A and the cathode of the diode 34, and the cathode of the diode 34 is grounded through the resistor 37, instead of the capacitor 30. In this embodiment, the capacitor 36 is charged with the polarity shown in FIG. 6 during the positive half cycle of the input signal, and the capacitor 39 is charged with the polarity shown in FIG. 6 during the negative half cycle of the input signal. Other than the fact that the transistors 27 and 28 respectively are biased in the reverse direction, the operation is the same as in the first embodiment and a detailed explanation is omitted.

Figure 7:
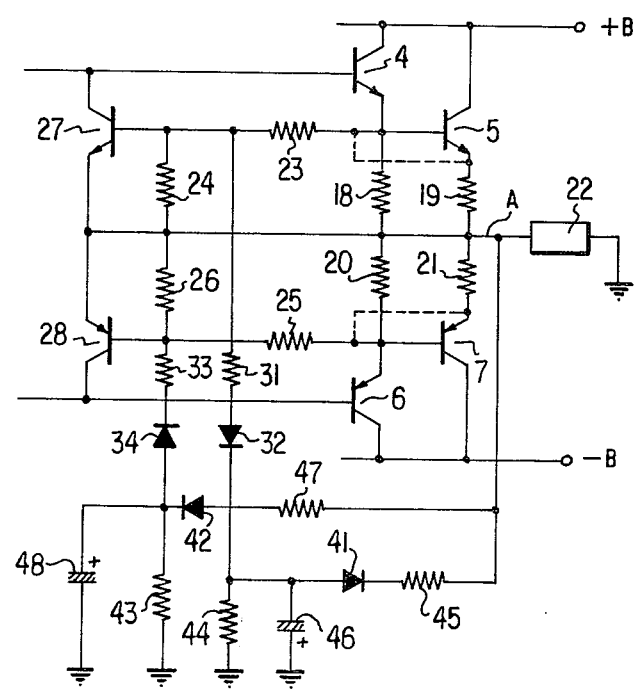
FIG. 7 is a circuit diagram of an SEPP amplifier according to the third practical embodiment of this invention.

FIG. 7 is a circuit diagram of a SEPP amplifier using the third practical embodiment of this invention. In FIG. 7, only the output circuit of the SEPP amplifier is shown.

In this embodiment, the circuit is configured by removing th capacitors 29 and 30 from the circuit of the first embodiment; and based on the circuit of the first embodiment, the cathode of the diode 32 is grounded through a series circuit of a resistor 44 and a capacitor 46, and the anode of the diode 34 is grounded through a series circuit of a resistor 43 and a capacitor 48. The cathode of the diode 32 is connected to the common output point A through the diode 41 and a resistor 45, and anode of diode 34 is connected to the common output point A through a resistor 47 and a diode 42. The operation of this embodiment is the same as the first embodiment, and a detailed explanation is omitted. However, in the case of this embodiment, the time at which the capacitors 46 and 48 are charged is different from the time at which the capacitors 29 and 30 are charged in the first embodiment, and it is in the opposite half cycle periods of the half cycles of the input signal. In other words, the capacitor 46 is charged with the polarity shown in FIG. 7 during the negative half cycle of the input signal and biases transistor 27 in the direction of cut-off, and the capacitor 48 is charged with the polarity shown in FIG. 7 during the positive half cycle of the input signal and biases transistor 28 in the direction of cut-off, thus increasing or decreasing the absolute values of the idling currents of the output transistors 5 and 7 according to the input signal.

As explained above, when this invention is used in an SEPP amplifier biased to perform class A or class AB amplification, not only does class A amplification occur at all times, but a class A power amplifier with high efficiency can be obtained because of the small idling currents of the output transistors with a small input signal owing to the fact that it is provided with a DC current limiting circuit comprised of transistors that are connected to the input of the output transistors of the SEPP amplifier and limits the idling currents of the output transistors when biased by a voltage corresponding to the output current of the output transistors; and a means to change the idling currents by increasing and decreasing the bias voltage of the transistors corresponding to the increased and decrease of the output voltage of the SEPP amplifier. Therefore, the capacity of the power supply for the amplifier is reduced, and the thermal radiator may also be small.

What is claimed is:

1. In a single-ended push-pull amplifier of the type biased so as to perform class A or class AB amplification, said amplifier having first and second output transistors connected to supply a driving current to a load connected to a common output of the amplifier, the improvement in a bias circuit for said amplifier comprising:

first and second DC limiting transistors connected respectively between said common output and the bases of said first and second output transistors;

first and second biasing means respectively connected to the bases of said first and second DC limiting transistors for supplying a bias voltage corresponding to the output current of said output transistors to thereby limit the idling currents of said output transistors when no input signal is applied to the amplifier; and means connected between said common output and the bases of said first and second DC limiting transistors for changing the idling currents of said first and second output transistors corresponding to a change in the output voltage at said common output whereby the amplifier continuously performs class A or class AB amplification.

2. The bias circuit as recited in claim 1, wherein said means for changing the idling currents comprises:
first and second capacitors respectively connected between the bases of said first and second DC limiting transistors and said common output; and
first and second series circuits each composed of a resistor and a diode and respectively connected between the bases of said first and second DC limiting transistors and ground, the diodes of said first and second series circuits being poled to conduct during alternate half cycles of an AC signal at said common output.

3. The bias circuit as recited in claim 1, wherein said means for changing the idling currents comprises:
first and second series circuits each having a resistor and a diode and respectively connected between the bases of said first and second DC limiting transistors and ground, the diodes of said first and second series circuits being oppositely poled;
third and fourth series circuits each having a resistor and a capacitor and respectively connected between the junction of the resistor and diode of said first and second series circuits and said common output.

4. The bias circuit as recited in claim 3, wherein said means for changing the idling currents further comprises a resistor connected in parallel with the diode in each of said first and second series circuits.

5. The bias circuit as recited in claim 1, wherein said means for changing the idling currents comprises:
first, second, third and fourth series circuits each having a resistor and a diode, the resistors of said first and second series circuits being respectively connected to the bases of said first and second DC limiting transistors and the resistors of said third and fourth series circuits being connected to said common output, the diodes of said first and third series circuits being connected to a first junction and poled in a first direction and the diodes of said second and fourth series circuits being connected to a second junction and poled in a second direction opposite to said first direction;
a first capacitor and a first resistor connected in parallel between said first junction and ground; and
a second capacitor and a second resistor connected in parallel between said second junction and ground.

6. The bias circuit as recited in claim 1, wherein each of said first and second output transistors comprise a Darlington pair and each of said first and second biasing means comprises a voltage divider connected between the emitter-base junction of the corresponding Darlington pair and said common output.

7. In a single-ended push-pull amplifier of the type biased so as to perform class A or class AB amplification, said amplifier having first and second output transistors connected to supply a driving current to a load connected to a common output of the amplifier, the improvement in a bias circuit for said amplifier comprising:
means for continuously changing the bias voltages to said output transistors corresponding to changes in the output current of said output transistors, so that the idling currents of the output transistors effectively follow the input signal power whereby the amplifier continuously performs class A or class AB amplification.

* * * * *